US007858269B2

(12) United States Patent
Landis et al.

(10) Patent No.: US 7,858,269 B2
(45) Date of Patent: Dec. 28, 2010

(54) STRUCTURE AND METHOD FOR SUB-RESOLUTION DUMMY CLEAR SHAPES FOR IMPROVED GATE DIMENSIONAL CONTROL

(75) Inventors: Howard S. Landis, Underhill, VT (US); David P. Parker, Maricopa, AZ (US); Jeanne-Tania Sucharitaves, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 410 days.

(21) Appl. No.: 11/687,230

(22) Filed: Mar. 16, 2007

(65) Prior Publication Data

US 2008/0226992 A1 Sep. 18, 2008

(51) Int. Cl.
*G03F 1/00* (2006.01)
(52) U.S. Cl. .............................. 430/5; 716/19
(58) Field of Classification Search ...... 430/5, 430/22, 30; 716/19, 21
See application file for complete search history.

(56) References Cited

U.S. PATENT DOCUMENTS

| 5,879,839 | A | 3/1999 | Jung et al. |
| 6,106,979 | A * | 8/2000 | Pierrat ............................ 430/5 |
| 6,197,452 | B1 | 3/2001 | Matumoto |
| 6,503,667 | B1 | 1/2003 | Kobayashi |
| 6,558,853 | B1 * | 5/2003 | Kawamura ..................... 430/5 |
| 6,599,665 | B1 | 7/2003 | Lin et al. |
| 6,730,445 | B2 | 5/2004 | Angelopoulos et al. |
| 6,787,272 | B2 * | 9/2004 | Yu ................................ 430/5 |
| 6,858,357 | B2 | 2/2005 | Angelopoulos et al. |
| 2002/0155357 | A1 * | 10/2002 | LaCour ......................... 430/5 |
| 2004/0161679 | A1 * | 8/2004 | Dai et al. ........................ 430/5 |
| 2005/0009344 | A1 * | 1/2005 | Hwang et al. ................ 438/689 |
| 2005/0053846 | A1 | 3/2005 | Shin et al. |
| 2005/0136338 | A1 * | 6/2005 | Chang ........................... 430/5 |
| 2005/0148195 | A1 * | 7/2005 | Koehle et al. ................ 438/709 |
| 2007/0281218 | A1 * | 12/2007 | Landis .......................... 430/5 |

FOREIGN PATENT DOCUMENTS

JP          2000003027 A    1/2000

* cited by examiner

*Primary Examiner*—Mark F Huff
*Assistant Examiner*—Stewart A Fraser
(74) *Attorney, Agent, or Firm*—DeLio & Peterson, LLC; Peter W. Peterson

(57) ABSTRACT

A mask system for use by a lithographic system to project an image of a circuit design. The design includes at least one large feature and at least one nearby small feature. The mask comprises one or more shapes on a mask to project an image of the nearby small feature and, on the same mask or on a different mask, an opaque shape to project an image of the large feature. The opaque shape includes in a field thereof at least one dummy clear shape of size and configuration insufficient to be resolved. Light from the lithographic projection system may be projected through the opaque shape and the dummy clear shape to resolve an image of the large circuit feature on a resist layer of a wafer without resolving the clear shape on the resist layer, while simultaneously increasing optical flare on the resolved large circuit feature image.

20 Claims, 3 Drawing Sheets

STRUCTURE AND METHOD FOR SUB-RESOLUTION DUMMY CLEAR SHAPES FOR IMPROVED GATE DIMENSIONAL CONTROL

BACKGROUND OF THE INVENTION

1. Field of the Invention

The present invention is directed to the manufacture of masks used in the lithographic production of integrated circuits and, in particular, to the manufacture of masks for improved gate dimensional control.

2. Description of Related Art

Variations in local pattern density are known to affect the final dimension of critical semiconductor features, including polysilicon gates. One important mechanism connecting pattern density and gate critical dimension is optical flare, wherein the photoresist dimension of a critical gate feature is impacted by a paucity of scattered light from nearby dark features on the photomask reticle. For advanced technologies with very fine gate features, the linewidth variations associated with locally-low optical flare conditions can have profound a effect on the operating frequency and the power draw of the final device.

A well-know solution to this problem is a set of layout constraints that constrain the maximum local density of gate features. These constraints may apply across the entire design, or only in the immediate vicinity of critical gates. Density-related layout constraints drive longer design cycles and larger chips. Locally high-density regions in a copper wiring layout are sometimes accommodated by the automatic placement of clear openings in the interior of wide copper features, which openings transmit light images corresponding to their shapes. Since these clear openings are resolved in the resist layer on the wafer, and result in the final device as gaps in the copper feature, this approach is not appropriate for gate features that would not function appropriately with a perforated interior.

SUMMARY OF THE INVENTION

Bearing in mind the problems and deficiencies of the prior art, it is therefore an object of the present invention to provide an improved method of lithographically imaging a circuit design which has features that, when projected by conventional opaque mask shapes, result in a high variation in scattered light and optical flare.

It is another object of the present invention to provide an improved layout of a mask used by a lithographic system to project an image of a circuit design which includes fine or small circuit features adjacent one or more large dark features.

A further object of the invention is to provide a method of lithographically projecting a circuit design that reduces variations caused by optical flare.

It is yet another object of the present invention to provide a method of designing and lithographically project an image of a circuit design having a higher density of one or more large circuit features nearby one or more small circuit features.

It is a further object of the present invention to provide a method of generating sub-resolution dummy clear shapes in the layout of an otherwise opaque feature on a mask used by a lithographic system to project an image of a circuit design including one or more small circuit features adjacent a large feature.

Still other objects and advantages of the invention will in part be obvious and will in part be apparent from the specification.

The above and other objects, which will be apparent to those skilled in the art, are achieved in the present invention which is directed to in one aspect to a method of designing a mask used by a lithographic system to project an image of a circuit design. The design includes at least one large feature and at least one small feature spaced from the large feature. The method comprises identifying a large feature in the design nearby at least one small feature, and providing on the layout of a mask a shape corresponding to the identified large feature and, in a field of the large feature shape, at least one dummy clear shape of size and configuration insufficient to resolve the clear shape with a light source used in the lithographic projection system. The method then includes creating a mask including an opaque shape corresponding to the layout of the identified large feature shape and the at least one dummy clear shape in the field of the large feature shape. Light from the lithographic projection system light source may be projected through the opaque shape and at least one dummy clear shape to resolve an image of the identified large circuit feature on a resist layer of a wafer without resolving the clear shape on the resist layer, while simultaneously increasing optical flare on the resolved identified large circuit feature image.

The method may further include laying out and creating, on the same mask or on a different mask, one or more shapes corresponding to and sufficient to project an image of the nearby at least one small feature.

In another aspect, the present invention is directed to a mask system for use by a lithographic system to project an image of a circuit design. The design includes at least one large feature and at least one small feature nearby the large feature. The mask comprises one or more shapes on a mask corresponding to and sufficient to project an image of the nearby at least one small feature and, on the same mask or on a different mask, an opaque shape corresponding to and sufficient to project an image of the large feature. The opaque shape includes in a field thereof at least one dummy clear shape of size and configuration insufficient to resolve the clear shape with a light source used in the lithographic projection system. Light from the lithographic projection system may be projected through the opaque shape and the at least one dummy clear shape to resolve an image of the large circuit feature on a resist layer of a wafer without resolving the clear shape on the resist layer, while simultaneously increasing optical flare on the resolved large circuit feature image.

The dummy clear shape preferably comprises at least about 20 percent, and no more than about 35 percent, of the total area of the opaque shape corresponding to the layout of the identified large feature shape.

The dummy clear shape may have a rectangular configuration or a square configuration. The dummy clear shape may have an opaque portion in a central area thereof.

There may be included at least two dummy clear shapes in the field of the large feature shape, with each dummy clear shape being of size and configuration insufficient to resolve the clear shape with a light source used in the lithographic projection system. Preferably, the dummy clear shapes comprise in total from about 20 to 35 percent of the total area of the opaque shape corresponding to the layout of the identified large feature shape.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-3 of the drawings in which like numerals refer to like features of the invention.

The method of designing the mask of the present invention is most useful in connection with integrated circuit design features employed in semiconductor applications in which a linewidth sensitive feature, such as the gate region of a transistor, is nearby a large, dark feature. In FIG. 1, there is depicted an exemplary portion of an integrated circuit layout design comprising segments that includes a large polysilicon feature 20 such as a decoupling capacitor, and adjacent narrow polysilicon gate structures 22a, 22b, 22c and 24a, 24b, 24c, for which dimensional control is of critical importance. These gate structures of the integrated circuit design have a critical width along their lengths, and are all parallel.

Figure 1:
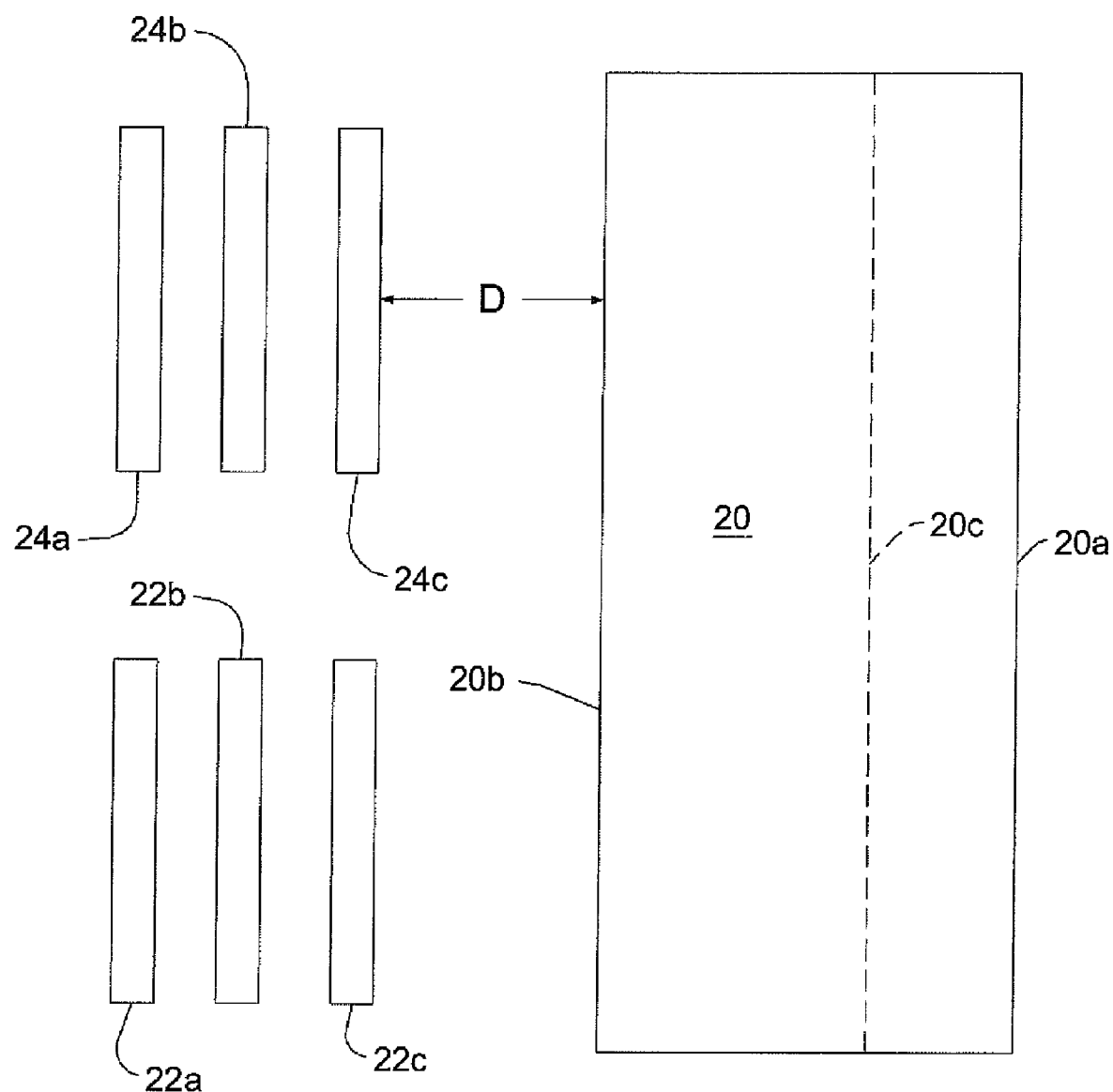
FIG. 1 is a plan view of an integrated circuit design showing spaced, adjacent large and linewidth-sensitive features.

In FIG. 1, the distance D represents the desired space between the closest linewidth sensitive gate feature, and the large circuit feature nearby. The small linewidth sensitive circuit feature may be of critical dimension. (As used herein, the term critical dimension refers to any dimension smaller than the smallest dimension that can be printed within a specified tolerance by a lithographic process without the need for a resolution enhancement technique such as alternating phase shift mask lithography.) When these features are projected onto a wafer resist layer by a conventional lithography system, dimensional variations from optical flare, or scattered light from nearby features, depend on the local density of nearby shapes. The term "nearby" as used in this context means a distance range from about one optical radius for the light energy used in the lithographic system, for example, about 650 nm (0.65 μm) for current lithography tools, to as much as 25 μm. Conventional layout ground rules requiring a large space between the critical gates and high-density regions of large size features are sometimes used to reduce the linewidth tolerance of critical gates due to optical flare. However, these rules reduce the achievable total decoupling capacitance, or increase the chip size, or both.

As is a common practice in the semiconductor industry, the space or distance D between critical gates 22c and 24c and the near edge 20b of large gate feature 20 is often increased above the desired distance, so as to reduce the local pattern density near the critical gates. This approach is at the expense of increased chip size in order to maintain functionality, such as total decoupling capacitance. Alternatively, the size of the large gate structure 20 may be reduced, such as by moving opposite edge 20a to location 20c. This is also common practice in the semiconductor industry, and has the effect of reducing the local pattern density near the critical gates. This approach also has a disadvantage in that it tends to reduce functionality, i.e., total decoupling capacitance, in order to maintain a smaller chip size.

Figure 2:
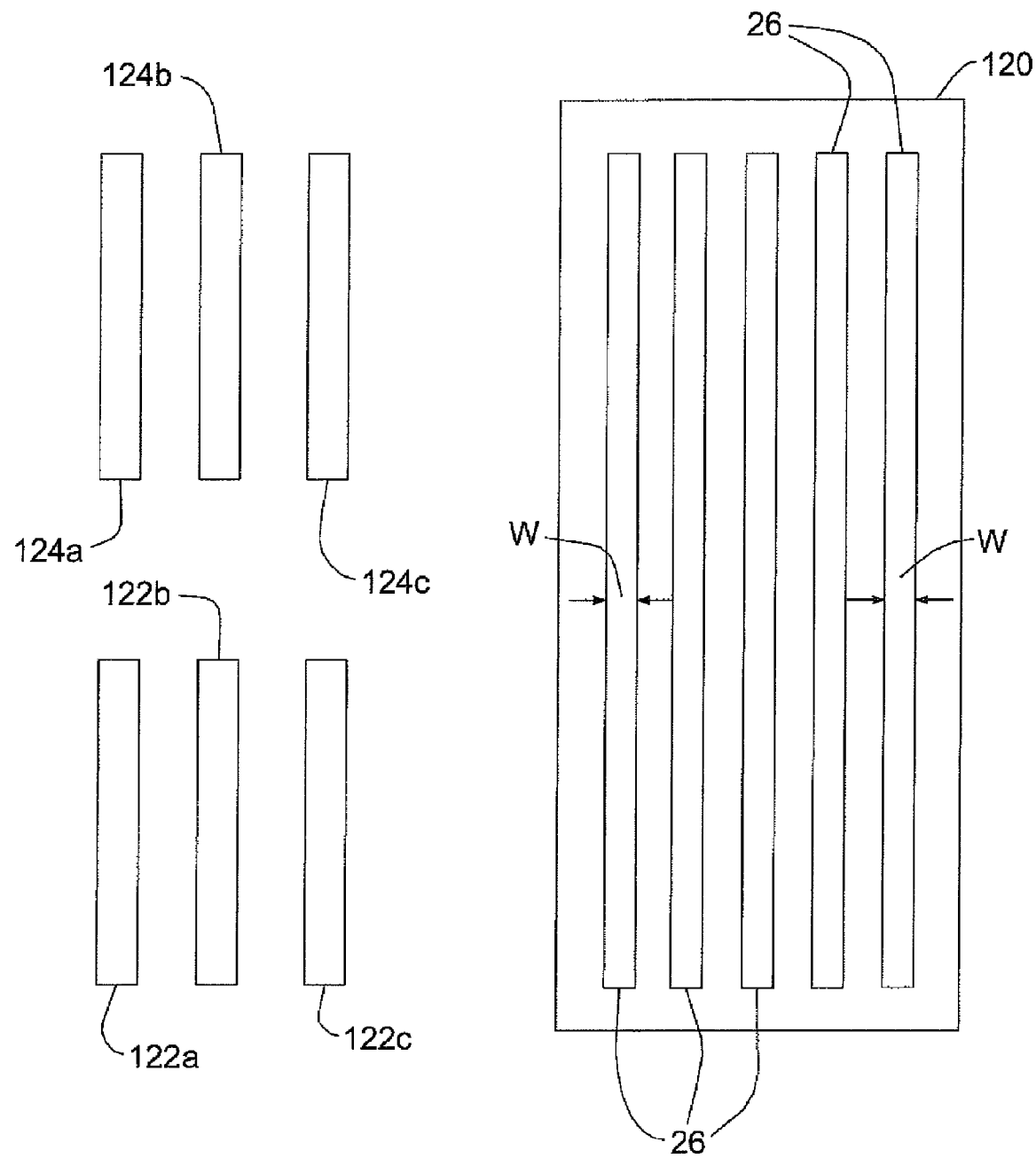
FIG. 2 is a plan view of the layout of a mask used to project the circuit design of FIG. 1, made in accordance with the present invention to employ sub-resolution clear spaces in the large feature region.

FIG. 2 shows the layout of a first preferred embodiment of a mask or reticle used to project the features shown in the circuit design of FIG. 1. Opaque shapes 120, 122a, 122b, 122c, 124a, 124b, 124c correspond to and project the image of circuit features 20, 22a, 22b, 22c, 24a, 24b, 24c, respectively. To permit smaller critical gates to be formed, there are provided on the reticle very small clear features 26 within the central field of opaque shape or region 120 whose outer periphery corresponds to the outline of the large circuit feature, decoupling capacitor 20. These small features 26 are clear, i.e., essentially transparent to the light energy used in the lithographic system, but are too small to print in the resist layer of the wafer onto which the circuit images are projected. By use of these dummy sub-resolution features 26, it is possible to reduce the paucity of scattered light, optical flare, near large gate features without affecting the form or function of the gate features incorporated in the final semiconductor device. By improving the uniformity of optical flare in the vicinity of large gate features, the dimensional control of the nearby critical gates can be significantly improved. This improvement in gate critical dimension from sub-resolution dummy clears can be achieved without the increase in chip size that would accompany conventional layout-constraint approaches. These sub-resolution dummy clear features can be created by automated methods after the layout of gate features is complete In FIG. 2, the sub-resolution dummy clear shapes 26 comprise spaced parallel line or rectangular bar shapes placed within a large opaque shape 120 corresponding to the large gate feature 20 (FIG. 1). These clear features 26 preferably occupy from about 20% to 35% of the total area of the opaque shape, and are sufficiently dense so as to increase the amount of scattered light incident on nearby critical gate features when the light of the lithographic projector is passed through the mask. However, the widths w of these clear bar shapes 26 are too small to resolve as openings in the large gate feature 20 when projected onto the photoresist layer of the wafer. The width w should be small enough so that they do not print on the resist layer, but large enough to permit sufficient scattered light to pass through to reduce variations caused by optical flare. Because they do not resolve in the photoresist or in the final device, such sub-resolution dummy clear shapes can be placed within any large gate structure that would otherwise exhibit a too-high local pattern density.

Figure 3:
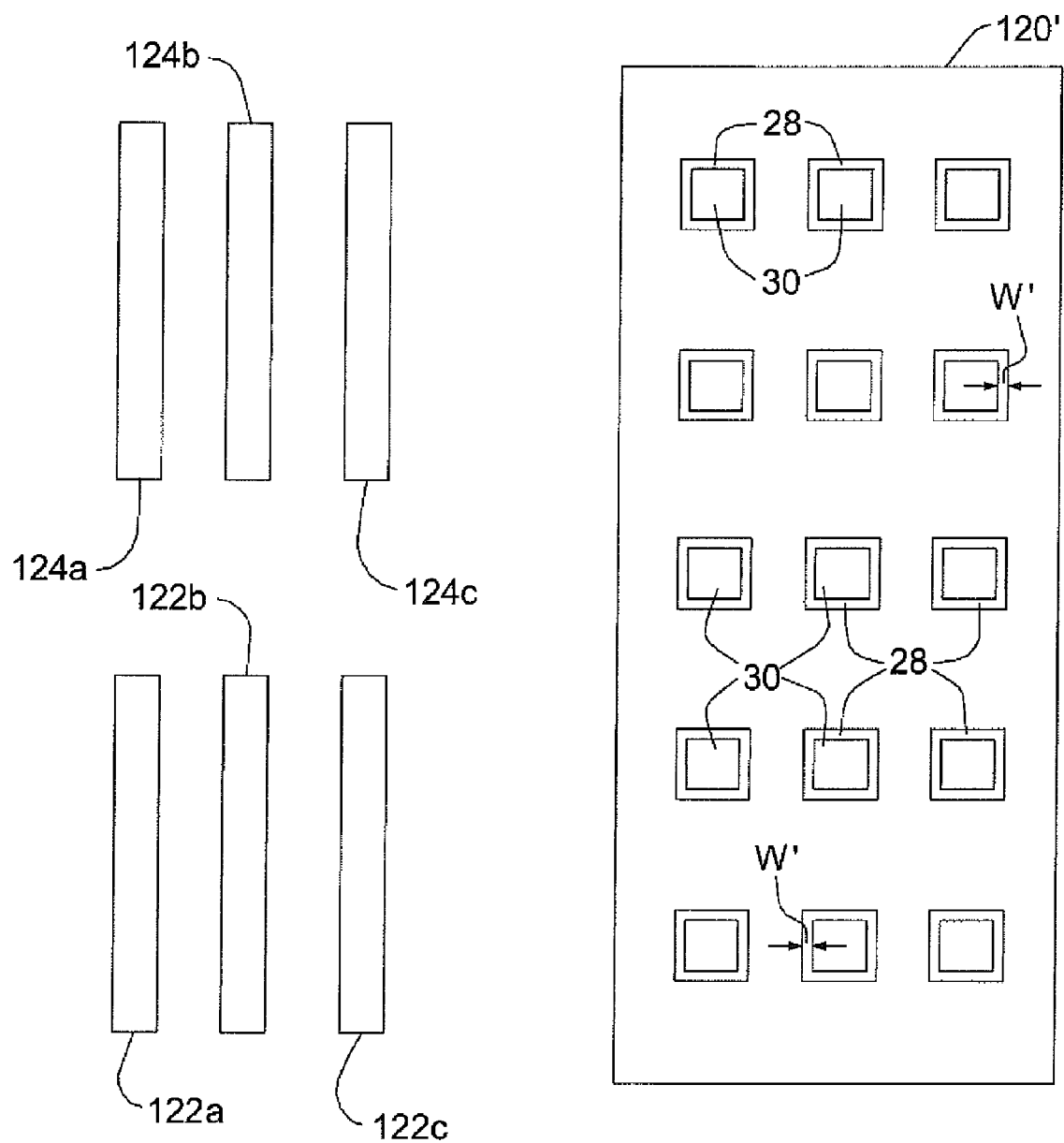
FIG. 3 is a plan view of a variation of the mask of FIG. 2 made in accordance with the present invention.

An alternative layout style for the mask employing sub-resolution dummy clear shapes is shown in FIG. 3. Opaque shape 120' corresponds to and projects the image of circuit feature 20. Instead of parallel line shapes as in the embodiment of FIG. 2, there are provided clear shapes 28 in the form resembling square donuts, each having a square outer periphery extending around a square central opaque inner periphery 30. The width w' of the clear portion is again less than that which is able to be resolved when light is projected through the mask in a lithographic system. In addition to the bars in FIG. 2 and the square donuts in FIG. 3, other shapes of sub-resolution size can be used with the same effect.

The structures and techniques described above to add sub-resolution clear features can be applied to any physical layer in a semiconductor design for which the linewidth is significantly affected by optical flare, or by other physical mechanisms related to on-reticle local pattern density.

Although FIGS. 2 and 3 shows opaque segments used to create the critical gate features 22a, 22b, 22c, 24a, 24b, 24c shown in FIG. 1, alternating phase shift mask (altPSM) processing may also be used to create the small gate features utilizing a two mask system. Such altPSM processing is well know and is disclosed in, for example, U.S. Patent Publication No. 2005/0175906, the disclosure of which is hereby incorporated by reference. Such gate or other small features are created by light passing through two adjacent shapes that is 180° out of phase, so that their electric field vector will be of equal magnitude, but point in exactly the opposite direction, and any interaction between these overlapping light beams results in perfect cancellation. Two-mask altPSM lithography offers improved resolution and dimensional control relative for critical dimension features as compared to standard masks using conventional opaque segments, made for example by employing chrome over glass (COG) techniques.

In accordance with the present invention, dummy clear shapes of subresolution size are placed in the otherwise opaque field of a shape used to create large features of the circuit design that receive insufficient scattered light or optical flare. To practice the method of the present invention, initially there is loaded into a automated mask design apparatus a layout of a complete circuit design of small, critical dimension features, for example, gates, adjacent a large feature, for example, a decoupling capacitor, the circuit design, as in the circuit design of FIG. 1. Then, the large features of the circuit design are identified, and those that receive insufficient scattered light or optical flare are identified. The sub-resolution dummy clear shapes of desired size and configuration are then created on the mask layout of the opaque shape for the identified large circuit, along with any other shapes (opaque or altPSM) to create the other circuit features.

After the mask layouts are completed, the masks themselves are rendered or formed by well-known techniques. The masks are then used in otherwise conventional photolithography to expose the circuit images onto the resist layer on a wafer, after which the resist layer is developed and etched, and the circuit features are formed on the wafer.

The result of the placement of sub-resolution dummy clear shapes in the otherwise opaque fields of large circuit features is that scattered light and optical flare are increased. The number, size and configuration of these sub-resolution dummy clear shapes are selected by considering the scattered light and optical flare or other nearby (typically small) features, so that the result is that during lithographic projection of the mask image onto the resist layer, the uniformity of optical flare in the vicinity of the large circuit features is increased and improved.

Thus, the present invention provides an improved layout of a mask used by a lithographic system to project an image of a circuit design which includes fine or small circuit features adjacent one or more large dark features, and enables creation of circuit designs having a higher density of one or more large circuit features nearby one or more small circuit features.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of designing a mask used by a lithographic system to project an image of a circuit design, the design including at least one large feature and at least one small feature spaced from the large feature, the method comprising:
   identifying a large feature in the design nearby at least one small feature;
   providing on the layout of a mask a shape having an outer periphery corresponding to the identified large feature and, in a field of the large feature shape within the outer periphery, at least one dummy clear shape of size and configuration insufficient to resolve the clear shape with a light source used in the lithographic projection system; and
   creating a mask including an opaque shape having an outer periphery corresponding to the layout of the identified large feature shape and the at least one dummy clear shape in the field of the large feature shape within the outer periphery, whereby light from the lithographic projection system light source may be projected through the mask containing the opaque shape and through the at least one dummy clear shape to resolve an image of the identified large circuit feature on a resist layer of a wafer without resolving the clear shape on the resist layer, while simultaneously increasing optical flare on the resolved identified large circuit feature image.

2. The method of claim 1 further including laying out and creating, on the same mask or on a different mask, one or more shapes corresponding to and sufficient to project an image of the nearby at least one small feature.

3. The method of claim 1 wherein the dummy clear shape comprises at least about 20 percent of the total area of the opaque shape corresponding to the layout of the identified large feature shape.

4. The method of claim 1 wherein the dummy clear shape comprises no more than about 35 percent of the total area of the opaque shape corresponding to the layout of the identified large feature shape.

5. The method of claim 1 wherein the dummy clear shape comprises from about 20 to 35 percent of the total area of the opaque shape corresponding to the layout of the identified large feature shape.

6. The method of claim 1 wherein the dummy clear shape has a rectangular configuration.

7. The method of claim 1 wherein the dummy clear shape has a square configuration.

8. The method of claim 1 wherein the dummy clear shape has an opaque portion in a central area thereof.

9. The method of claim 1 including at least two dummy clear shapes in the field of the large feature shape, each dummy clear shape being of size and configuration insufficient to resolve the clear shape with a light source used in the lithographic projection system.

10. The method of claim 1 wherein the dummy clear shapes comprise in total from about 20 to 35 percent of the total area of the opaque shape corresponding to the layout of the identified large feature shape.

11. A mask system for use by a lithographic system to project an image of a circuit design, the design including at least one large feature and at least one small feature nearby the large feature, the mask comprising one or more shapes on a mask corresponding to and sufficient to project an image of the nearby at least one small feature and, on the same mask or on a different mask, an opaque shape having an outer periphery corresponding to and sufficient to project an image of the large feature, the opaque shape including in a field thereof, within the outer periphery, at least one dummy clear shape of size and configuration insufficient to resolve the clear shape with a light source used in the lithographic projection system, whereby light from the lithographic projection system may be projected through the mask containing the opaque shape and through the at least one dummy clear shape to resolve an image of the large circuit feature on a resist layer of a wafer without resolving the clear shape on the resist layer, while simultaneously increasing optical flare on the resolved large circuit feature image.

12. The mask system of claim 11 wherein the dummy clear shape comprises at least about 20 percent of the total area of the opaque shape corresponding to the layout of the identified large feature shape.

13. The mask system of claim 11 wherein the dummy clear shape comprises no more than about 35 percent of the total area of the opaque shape corresponding to the layout of the identified large feature shape.

14. The mask system of claim 11 wherein the dummy clear shape comprises from about 20 to 35 percent of the total area of the opaque shape corresponding to the layout of the identified large feature shape.

15. The mask system of claim 11 wherein the dummy clear shape has a rectangular configuration.

16. The mask system of claim 11 wherein the dummy clear shape has a square configuration.

17. The mask system of claim 11 wherein the dummy clear shape has an opaque portion in a central area thereof.

18. The mask system of claim 11 including at least two dummy clear shapes in the field of the large feature shape, each dummy clear shape being of size and configuration insufficient to resolve the clear shape with a light source used in the lithographic projection system.

19. The mask system of claim 18 wherein the dummy clear shapes comprise in total from about 20 to 35 percent of the total area of the opaque shape corresponding to the layout of the identified large feature shape.

20. The mask system of claim 11 wherein the dummy clear shape has a rectangular configuration, optionally with an opaque portion in a central area thereof.

* * * * *